(12) United States Patent
Joe et al.

(10) Patent No.: US 6,498,572 B1
(45) Date of Patent: Dec. 24, 2002

(54) METHOD AND APPARATUS FOR DELTA MODULATOR AND SIGMA DELTA MODULATOR

(75) Inventors: Jurianto Joe, Singapore (SG); Kin Mun Lye, Singapore (SG)

(73) Assignee: The National University of Singapore, Singapore (SG)

( * ) Notice: Subject to any disclaimer, the term of this patent is extended or adjusted under 35 U.S.C. 154(b) by 0 days.

(21) Appl. No.: 09/919,079

(22) Filed: Jul. 30, 2001

Related U.S. Application Data (60) Provisional application No. 60/299,408, filed on Jun. 18, 2001.

(51) Int. Cl.$^7$ ................................................ H03M 3/00
(52) U.S. Cl. ..................... 341/143; 341/111; 341/133; 341/118; 341/120; 341/166; 318/798
(58) Field of Search ................................ 341/143, 133, 341/111, 113, 118, 120, 166

(56) References Cited

U.S. PATENT DOCUMENTS

| | | |
|---|---|---|
| 3,209,282 A | 9/1965 | Schnitzler |
| 3,239,832 A | 3/1966 | Renard |
| 3,246,256 A | 4/1966 | Sommers, Jr. |
| 3,303,350 A | 2/1967 | Neff et al. |

(List continued on next page.)

FOREIGN PATENT DOCUMENTS

| | | |
|---|---|---|
| DE | 94 855 | 1/1973 |
| DE | 2459531 A1 | 7/1976 |
| DE | 2602794 A1 | 7/1977 |
| DE | 19809334 A1 | 9/1999 |
| FR | 1 438 262 | 7/1966 |
| GB | 1036328 | 7/1966 |
| JP | 11074766 | 3/1999 |

OTHER PUBLICATIONS

Abell, E., "Gated Oscillator Emulates a Flip–Flop", EDN Access, pps. 1–2, Mar. 16, 1995.
Gallerani, A., "Oscillator Meets Three Requirements", EDN Access, pps. 119–120, Dec. 3, 1998.
L. Goras et al., "On Linear Inductance–and Capacitance–Time Conversions Using NIC–Type Configuration," IEEE Transactions on Industrial Electronics, vol. 40, No. 5. pp. 529–531 (Oct. 1993).
V.H. Jakubaschk, "das Grosse Elektronikbastelbuch,", Deutscher Militärverlag, Leipzig, pp. 206–209 (1968).

(List continued on next page.)

*Primary Examiner*—Michael Tokar
*Assistant Examiner*—Linh Van Nguyen
(74) *Attorney, Agent, or Firm*—Townsend and Townsend and Crew LLP; Kenneth R. Allen (57) ABSTRACT

According to the invention, oscillating signals are generated from analog signals by providing an analog signal having a variable slope or amplitude to a circuit with a variable operating point and having a transfer function characterized by an unstable operating region bounded by a first and a second stable operating region. The unstable operating region contains a first and a second reference point. The circuit is capable of producing an oscillating signal having a variable duty cycle, the duty cycle increasing as the variable operating point is positioned closer to the first reference point, the duty cycle decreasing as the variable operating point is positioned closer to the second reference point. The variable operating point is positioned substantially within the unstable region to produce the oscillating signal. The positioning of the operating point relative to the first and the second reference points is a function of the variable slope or amplitude of the analog signal. The oscillating signal is capable of being used to directly or indirectly generate a delta modulation or sigma delta modulation signal corresponding to the analog signal.

23 Claims, 4 Drawing Sheets

U.S. PATENT DOCUMENTS

| | | |
|---|---|---|
| 3,312,911 A | 4/1967 | De Boer |
| 3,387,298 A | 6/1968 | Kruy |
| 3,527,949 A | 9/1970 | Huth |
| 3,571,753 A | 3/1971 | Saunders |
| 3,755,696 A | 8/1973 | Nicholson et al. |
| 3,761,621 A | 9/1973 | Vollmeyer et al. |
| 3,846,717 A | 11/1974 | Fleming |
| 3,967,210 A | 6/1976 | Aumann |
| 4,028,562 A | 6/1977 | Zuleeg |
| 4,037,252 A | 7/1977 | Janssen |
| 4,365,212 A | 12/1982 | Gentile et al. |
| 4,425,647 A | 1/1984 | Collins et al. |
| 4,459,591 A | 7/1984 | Haubner et al. |
| 4,560,949 A | 12/1985 | Young |
| 4,599,549 A | 7/1986 | Mutoh et al. |
| 4,743,906 A | 5/1988 | Fullerton |
| 4,862,160 A | 8/1989 | Ekchian et al. |
| 5,012,244 A * | 4/1991 | Wellard et al. ............. 341/120 |
| 5,107,264 A | 4/1992 | Novof |
| 5,170,274 A | 12/1992 | Kuwata et al. |
| 5,274,375 A * | 12/1993 | Thompson ................. 341/118 |
| 5,337,054 A | 8/1994 | Ross et al. |
| 5,339,053 A | 8/1994 | Lux et al. |
| 5,532,641 A | 7/1996 | Balasubramanian et al. |
| 5,757,301 A * | 5/1998 | Kuo et al. ................. 341/143 |
| 5,764,702 A | 6/1998 | Caiaffa |
| 5,777,507 A | 7/1998 | Kaminishi et al. |
| 5,789,992 A | 8/1998 | Moon |
| 5,812,081 A | 9/1998 | Fullerton |
| 5,832,035 A | 11/1998 | Fullerton |
| 5,892,701 A | 4/1999 | Huang et al. |
| 5,901,172 A | 5/1999 | Fontana et al. |
| 6,023,672 A | 2/2000 | Ozawa |
| 6,044,113 A | 3/2000 | Oltean |
| 6,060,932 A | 5/2000 | Devin |
| 6,087,904 A | 7/2000 | Wen |
| 6,259,390 B1 * | 7/2001 | Joe ............................ 341/133 |
| 6,275,544 B1 | 8/2001 | Aiello et al. |

OTHER PUBLICATIONS

James P. Keener, Analog Circuitry for the van der Pol and Fitz–Hugh—Nagumo Equations, IEEE 1983, pps. 1011–1015.

U. Tietze et al., "Halbleiter–Schaltungstechnik, Fünfte, überabeitete Auflage," Springer–Verlag, Berlin Heidelberg, New York, pp. 255–258 (1980).

Patarasen, S. et al., Maximum–Likelihood Symbol Synchronization and Detection of OPPM Sequeunces, IEEE Transactions on Communications, New York, US, Jun. 94, pps. 9, vol. 42, No. 6.

Sen et al., Integration of GaAs/AlAs Resonant Tunneling Diodes for Digital and Analog Applications with Reduced Circuit Complexity, Oct. 13–16, 1987.

D. Wang et al., "Image Segmentation Based on Oscillatory Correlation," Neural Computation, vol. 9, pp. 805–836 (1997).

Gang Li et al., "Performance of a Ratio–Threshold Diversity Combining Scheme in FFH/FSK Spread Spectrum Systems in Partial Band Noise Interference," Department of Electrical and Computer Engineering, and Communication Research Centre, IEEE 1992, pps. 0672–0676.

Gang Li et al., "Maximum–Likelihood Diversity Combining in Partial–Band Noise Interference Channel," Department of Electrical and Computer Engineering, and Communication Research Centre, IEEE 1993, pps. 507–511.

* cited by examiner

METHOD AND APPARATUS FOR DELTA MODULATOR AND SIGMA DELTA MODULATOR

CROSS-REFERENCES TO RELATED APPLICATIONS

This application is related to U.S. application Ser. No. 09/429,527 for METHOD AND APPARATUS FOR GENERATING PULSES FROM ANALOG WAVEFORMS, filed Oct. 28, 1999 now U.S. Pat. No. 6,259,390, which is owned by the Assignee of the present invention and is herein incorporated by reference for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

Delta modulators and sigma delta modulators have existed for many years and have potential to be used in a wide range of applications such as communication systems, precision measurement devices, audio systems, and many others. Operation of the delta modulator and sigma delta modulator transforms a band-limited input signal into a one-bit output signal such that output pulse density of the output signals is modulated by the input signal. The transformation process is achieved by oversampling the input signal. Information about these modulators can be easily obtained on World Wide Web, technical notes, and journal publications. See B. P. Agrawal and K. Shenoi, *Design Methodology For Sigma-Delta-M*, IEEE Trans. Commun., vol. COM-31, pp.360–370, March 1983; J. W. Scott, W. L. C. Giancario, and C. G. Sodini, *A CMOS slope adaptive delta modulator*, in Proc. IEEE Int. Solid-State Circuits Conf., Febuary 1986, pp.130–131; David Jarman, *A Brief Introduction to Sigma Delta Conversion*, Harris Semiconductor Application Note, May 1995; and *ADDA: CD Data Conversion* (last modified Nov. 28, 1999) <http://www.owlnet.rice.edu/~elec301/Projects99/adda/index.html>.

Figure 1A:
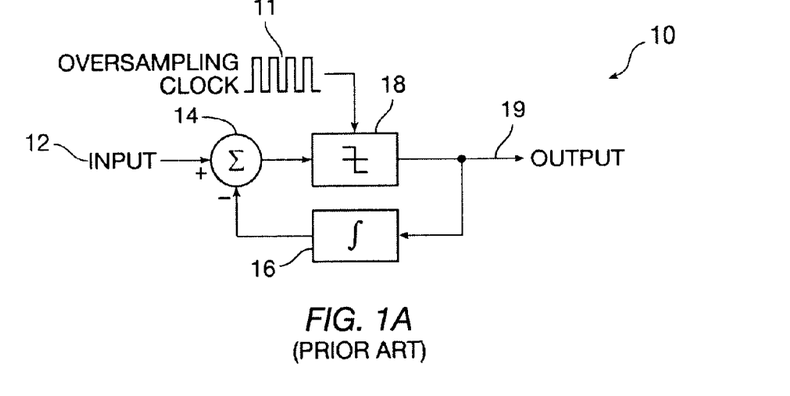
FIG. 1A shows building blocks for a conventional implementation of a delta modulator.

FIG. 1A shows building blocks for a conventional implementation of a delta modulator 10. An input signal 12 is received by a summing circuit 14. The summing circuit 14 also receives integrated output pulses from an integrator 16. A difference signal from the summing circuit 14 is applied to a quantizer 18. The quantizer 18 generates an output signal 19 that is applied to the integrator 16. The output signal 19 generated by the quantizer 18 is a positive pulse when the difference signal is negative. The output signal 19 generated by the quantizer 18 is a negative pulse when the difference signal is positive. An external oversampling clock 11 drives the delta modulator 10. This illustrates that the output of a delta modulator consists of pulses modulated by the slope of the input signal.

Figure 1B:
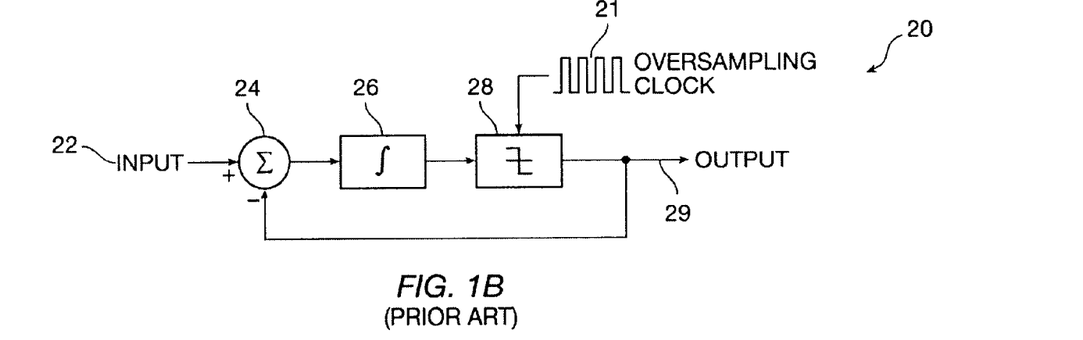
FIG. 1B shows building blocks for a conventional implementation of a sigma delta modulator.

FIG. 1B shows building blocks for a conventional implementation of a sigma delta modulator 20. The sigma delta modulator is a modification of the delta modulator. The modification is made to avoid slope overload due to low oversampling ratio. An input 22 is received by a summing circuit 24. The summing circuit 24 also receives an output signal 29. A difference signal from the summing circuit 24 is applied to an integrator 26. An integrated signal from the integrator 26 is applied to a quantizer 28. The quantizer generates the output signal 29. An external oversampling clock 21 drives the sigma delta modulator 20. This illustrates that the output of a sigma delta modulator consists of pulses modulated by the amplitude of the input signal.

Figure 2:
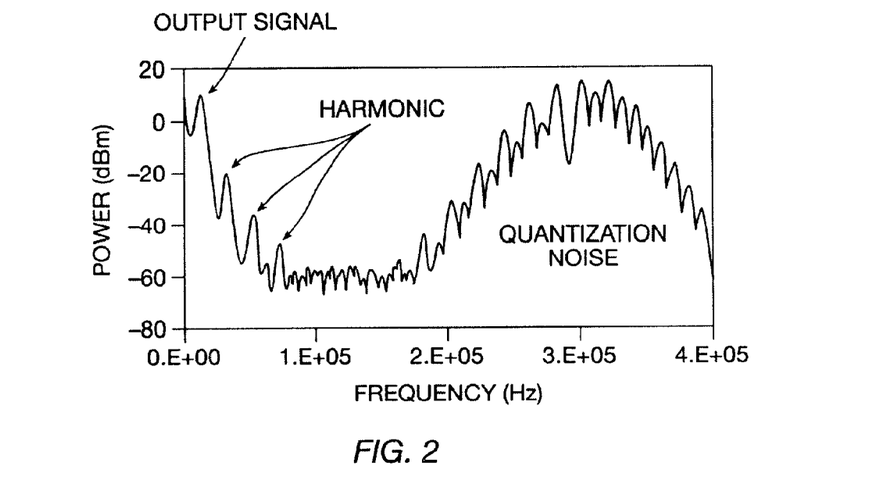
FIG. 2 illustrates the measured power of both the output signal and the quantization noise in a conventional implementation of a delta modulator or sigma delta modulator.

FIG. 2 illustrates the measured power of both the output signal and the quantization noise in a conventional implementation of a delta modulator or sigma delta modulator. Here, the oversampling rate determines the frequency range of the quantization noise shown. As can be seen, if oversampling rate is too low, the quantization noise might not be well separated from the desired output signal, and that may seriously affects the quality of the output signal.

Since quantization noise is directly related to oversampling ratios, increasing the oversampling rate is a logical approach to reducing effects of quantization noise. However, as illustrated by FIGS. 1A and 1B, conventional implementations of both the delta modulator and the sigma delta modulator require a number of circuit blocks, such as an integrator, a summing circuit, a quantizer, and an external oversampling clock to drive the modulator. To operate all of this hardware at an oversampled rate, which is usually much larger than the input signal bandwidth, requires great circuit complexity. In addition, a higher oversampling ratio requires a higher speed external oversampling clock, which can add a significant or even prohibitive cost. Thus increasing the oversampling rate has not been practical in conventional implementations of the delta an sigma delta modulators. Increasing the order of the modulator can also decrease quantization noise, however, such an approach also increases circuit complexity and tend to result in less stable systems.

For the above reasons, conventional implementations of the delta modulator and sigma delta modulator have limited the use these conceptually elegant devices to low frequency applications.

SUMMARY OF THE INVENTION

According to the invention, oscillating signals are generated from analog signals by providing an analog signal having a variable slope or amplitude to a circuit with a variable operating point and having a transfer function characterized by an unstable operating region bounded by a first and a second stable operating region. The unstable operating region contains a first and a second reference point. The circuit is capable of producing an oscillating signal having a variable duty cycle, the duty cycle increasing as the variable operating point is positioned closer to the first reference point, the duty cycle decreasing as the variable operating point is positioned closer to the second reference point. The variable operating point is positioned substantially within the unstable region to produce the oscillating signal. The positioning of the operating point relative to the first and the second reference points is a function of the variable slope or amplitude of the analog signal. The oscillating signal is capable of being used to directly or indirectly generate a delta modulation or sigma delta modulation signal corresponding to the analog signal.

In a specific embodiment, the oscillating signal comprises a plurality of pulses.

In a specific embodiment, a more positive value of the slope or amplitude of the analog signal corresponds to a closer positioning of the variable operating point relative to one of the first and the second reference points, and wherein a more negative value of the slope or amplitude of the analog signal corresponds to a closer positioning of the variable operating point relative to another of the first and the second reference points.

The invention will be better understood by reference to the following description in connection with the accompanying drawings.

DESCRIPTION OF SPECIFIC EMBODIMENTS

Figure 3:
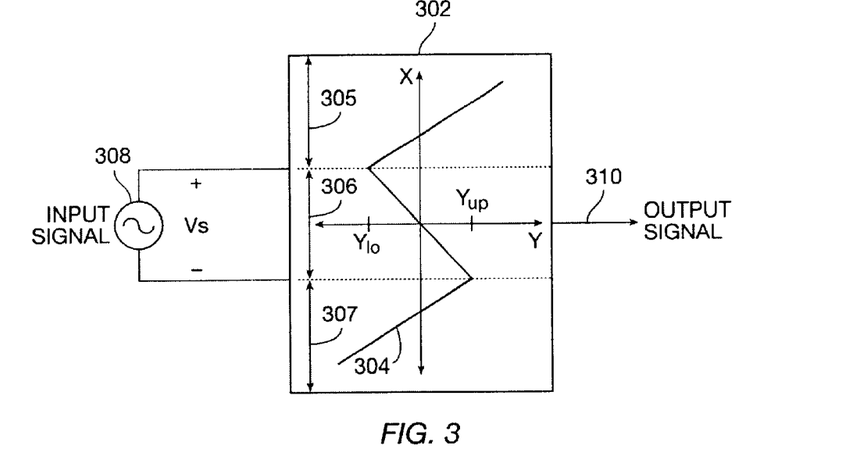
FIG. 3 illustrates use of a circuit having an S-shaped transfer function characterized by an unstable operating region bounded by a first stable operating region and a second stable operating region.

FIG. 3 illustrates use of a circuit 302 having an S-shaped transfer function 304 characterized by an unstable operating region 306 bounded by a first stable operating region 305 and a second stable operating region 307. A delta modulator can be implemented by applying an input signal 308 to the circuit 302. At any given time, the circuit 302 operates at an operating point along the S-shaped transfer function 304, which is defined on an X and Y axis. For implementing the delta modulator, the operating point is kept primarily within the unstable operating region 306. The regions above and below the unstable operating region 306 are the stable operating regions 305 and 307, respectively. In one preferred embodiment, the unstable operating region 306 is symmetrical, in at least one characteristic, about the origin of the X and Y axis, as to provide some measure of symmetry in responding to the input signal 308. Keeping the operating point within the unstable operating region 306 causes the circuit 302 to generate pulses at an output 310 of the circuit 302.

Moving the position of the operating point within the unstable region 306 cause the duty cycle of the pulses to vary. In one embodiment, when the operating point is at the center of the unstable operating region 306, the duty cycle of the pulses generated by the circuit 302 is at or near 50%. As the operating point is driven closer to reference point $Y_{up}$, the duty cycle become larger (i.e. larger than 50%), and as the operating point is driven closer to another reference point $Y_{lo}$, the duty cycle becomes smaller (i.e. smaller than 50%). Reference points $Y_{up}$ and $Y_{lo}$ can be adjusted to provide the desired dynamic range for the circuit 302. An example set of equations that describe the operation of the circuit 302 are as follows:

$$\frac{dY}{dt} = \frac{dV_s}{dt} - \alpha X$$

$$\varepsilon \frac{dX}{dt} = Y - \Psi(x)$$

The operating point for S-Shape transfer characteristic circuit can be found by setting $dY/dt=0$ and $dX/dt=0$. This is equivalent to the intersection between the lines $Y=\Psi(x)$ and $X=dV_s/\alpha dt$, where $dV_s/dt$ denotes the slope of the input signal 308. Here, it can be seen that it is the slope of the input signal 308 that drives the operating point and therefore determines the duty cycle of the pulse generated at the output.

Figure 4:
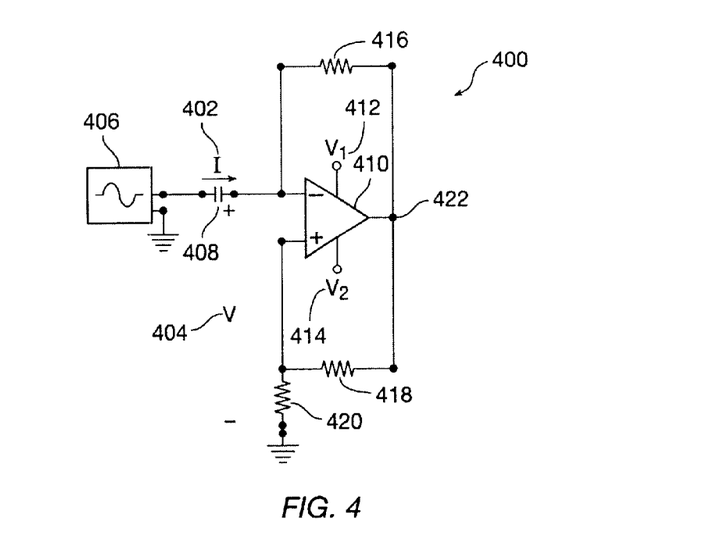
FIG. 4 shows a circuit that is an example of the system shown in FIG. 3.

FIG. 4 shows a circuit 400 that is an example of the system shown in FIG. 3. Here, the state the state variables X and Y correspond to a current I (402) and a voltage V (404), respectively. An input 406 is connected to one end of a capacitor 408. The other end of the capacitor 408 is connected to an inverting input terminal of an op-amp 410. The inverting input terminal of the op-amp 410 is also connected to one end of a resistor 416. The other end of the resistor 416 is connected to an output terminal of the op-amp 410. A non-inverting input terminal of the op-amp 410 is connected to one end of a resistor 418. The other end of the resistor 418 is connected to the output terminal of the op-amp 410. The non-inverting input terminal of the op-amp 410 is also connected to one end of a resistor 420. The other end of the resistor 420 is connected to ground. The output terminal of the op-amp 410 is connected to an output 422.

Note that the circuit 400 shown in FIG. 4 is quite simple and does not require any external oversampling clock. The frequency of pulses generated by the circuit 400 can be increased or decreased by simply modifying the value of components in the circuit 400. Thus, this circuit illustrates the ability of the present invention to allow implementations of the operation of a delta modulator without the use of any complex circuitry or external oversampling clock. Here, DC biases $V_1$ (412) and $V_2$ (414) of the op-amp 410 are set to 1.5 V and −1.5 V, respectively. By changing $V_1$ and $V_2$, $Y_{lo}$ and $Y_{up}$ can be adjusted to desired values. The capacitor 408 is selected to have a capacitance of $C_1=0.02$ uF. The resistors 416, 418, and 420 are selected to be 1 kΩ, 100 Ω, and 100Ω, respectively. The circuit parameters presented here contribute to characteristics of the system, such as pulse densities. For example, in the case of DC biasing, with the resistors 418 and 420 fixed, the frequency of pulses generated can be increased by reducing $R_2 C_1$, where $R_2$ represents the resistance of the resistor 416 and $C_1$ represents the capacitance of the capacitor 408. Nevertheless, the circuit(s) presented here and elsewhere in this application are merely illustrative examples. Different configurations, parameter, component values, and/or settings may also be used to achieve this embodiment of the present invention.

Thus, the circuit 400 is a realization of the operation of a delta modulator with the input 406 and the output 422. In this circuit, when the slope of the signal from the input 406 is negative, the duty cycle of pulses produced at the output 422 is larger than 50% because the operating point is closer to $Y_{up}$. On the other hand, when the slope of the signal from the input 406 is positive, the duty cycle of the pulses produced at the output 422 is smaller than 50% because the operating point is closer to $Y_{lo}$. For this case, the operating point of the circuit can be found by the intersection of the lines $V=\Psi(I)$ and $I=C_1 dV_s/dt$, where $V_S$ is the voltage of the signal from the input 406.

Figure 5:
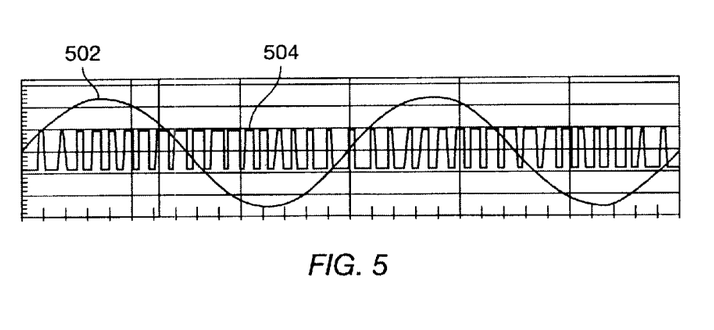
FIG. 5 shows the input and output of a delta modulator using a circuit configuration having an S-Shape transfer characteristic, such as the circuit shown in FIG. 4.

FIG. 5 shows the input and output of a delta modulator using a circuit configuration having an S-Shape transfer characteristic, such as the circuit shown in FIG. 4. An input signal 502 is a sine wave. An output signal 504 corresponding to the input signal 502 is a string of pulses with varying widths. As seen in FIG. 5, the pulses are modulated. For example, the pulse width is wider when the input signal slope is more negative, verifying the fact that the slope of the input signal is modulating the pulses.

Figure 6:
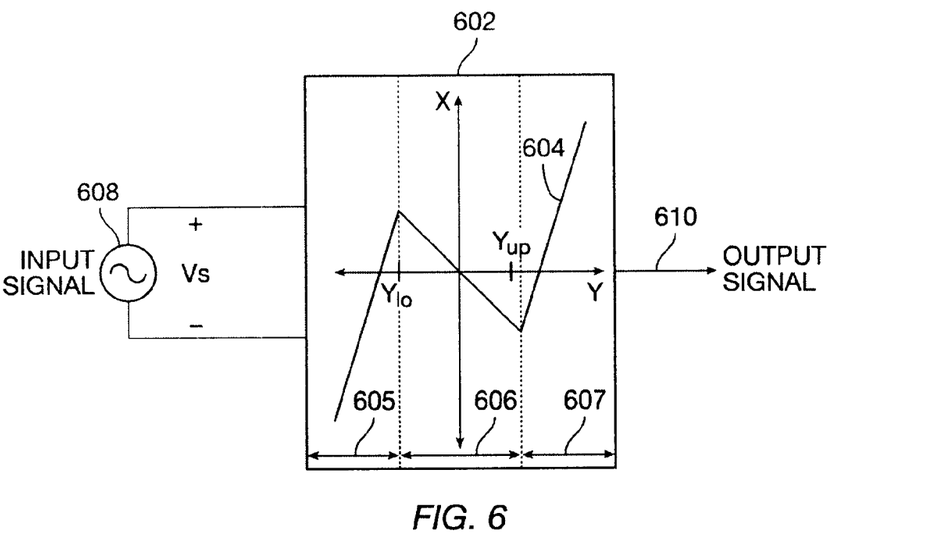
FIG. 6 illustrates use of a circuit having an N-shaped transfer function characterized by an unstable operating region bounded by a first stable operating region and a second stable operating region.

FIG. 6 illustrates use of a circuit 602 having an N-shaped transfer function 604 characterized by an unstable operating region 606 bounded by a first stable operating region 605 and a second stable operating region 607. A sigma delta modulator can be implemented by applying an input signal 608 to the circuit 602. At any given time, the circuit 602 operates at an operating point along the N-shaped transfer function 604, which is defined on an X and Y axis. For implementing the sigma delta modulator, the operating point is kept primarily within the unstable operating region 606. The regions to the left and right of the unstable operating region 606 are the stable operating regions 605 and 607, respectively. FIG. 6 also shows that in one preferred embodiment, the unstable operating region 606 is symmetrical about the origin of the X and Y axis, provide a measure of symmetry in responding to the input signal 608. Keeping the operating point within the unstable operating region 606 causes the circuit 602 to generate pulses at an output 610 of the circuit 602.

Moving the position of the operating point within the unstable region 606 cause the duty cycle of the pulses to vary. In one embodiment, when the operating point is at the center of the unstable operating region 606, the duty cycle of the pulses generated by the circuit 602 is at or near 50%. As the operating point is driven closer to reference point $Y_{up}$, the duty cycle become larger (i.e. larger than 50%), and as the operating point is driven closer to another reference point $Y_{lo}$, the duty cycle becomes smaller (i.e. smaller than 50%). Reference points $Y_{up}$ and $Y_{lo}$ can be adjusted to provide the desired dynamic range for the circuit 602. An example set of equations that describe the operation of the circuit 602 are as follows:

$$\alpha \frac{dX}{dt} = V_s - Y$$

$$\varepsilon \frac{dY}{dt} = X - \Psi(y)$$

The operating point for N-Shape transfer characteristic circuit can be found by setting $dY/dt=0$ and $dX/dt=0$. This is equivalent to the intersection between the $X=\Psi(Y)$ line and $Y=V_S$, where $V_S$ denotes the input signal 608. Here, it can be seen that it is the amplitude of the input signal 608 that drives the operating point and therefore determines the duty cycle of the pulse generated at the output.

Figure 7:
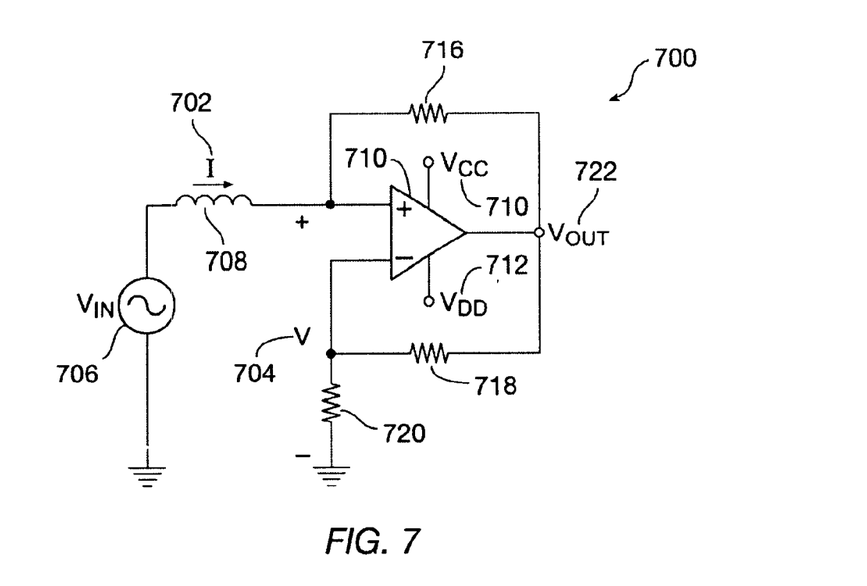
FIG. 7 shows a circuit that is an example of the system shown in FIG. 6.

FIG. 7 shows a circuit 700 that is an example of the system shown in FIG. 6. Here, the state the state variables X and Y correspond to a current I (702) and a voltage V (704), respectively. An input 706 is connected to one end of an inductor 708. The other end of the inductor 708 is connected to a non-inverting input terminal of an op-amp 710. The non-inverting input terminal of the op-amp 710 is also connected to one end of a resistor 716. The other end of the resistor 716 is connected to an output terminal of the op-amp 710. An inverting input terminal of the op-amp 710 is connected to one end of a resistor 718. The other end of the resistor 718 is connected to the output terminal of the op-amp 710. The inverting input terminal of the op-amp 710 is also connected to one end of a resistor 720. The other end of the resistor 720 is connected to ground. The output terminal of the op-amp 710 is connected to an output 722.

Note that the circuit 700 shown in FIG. 7 is quite simple and does not require any external oversampling clock. The frequency of pulses generated by the circuit 700 can be increased or decreased by simply modifying the value of components in the circuit 700. As an example, in the case that the DC biasing, resistors 718 and 720 are fixed, the frequency of pulses generated can be altered by varying L/R, where L is the inductor 708 and R is the resistor 716. Thus, this circuit illustrates the ability of the present invention to allow implementations of the operation of a sigma delta modulator without the use of any complex circuitry or external oversampling clock.

Here, DC biases $V_{cc}$ (712) and $V_{dd}$ (714) of the op-amp 710 are set to 5 V and −5 V, respectively. By changing $V_{cc}$ and $V_{dd}$, $Y_{lo}$, and $Y_{up}$ can be adjusted to desired values. The inductor 708 is selected to have an inductance of L=1 mH. The resistors 716, 718, and 720 are selected to be 1 kΩ, 1 kΩ, and 500Ω, respectively. The circuit parameters presented here contribute to characteristics of the system, such as pulse densities. For example, in the case of DC biasing, with the resistors 718 and 720 fixed, the frequency of pulses generated can be adjusted by varying L/R, where L is the inductance of the inductor 708 and R is the resistance of the resistor 716. Nevertheless, the circuit(s) presented here and elsewhere in this application are merely illustrative examples. Different configurations, parameter, component values, and/or settings may also be used to achieve this embodiment of the present invention.

Thus, the circuit 700 is a realization of the operation of a sigma delta modulator with the input 706 and the output 722. Operation of this circuit 700 can be compared to that of the circuit 400 discussed above that realizes the operation of a delta modulator, with the exception that the duty cycle of the pulses of this circuit 700 responds to the amplitude, as opposed to the slope of the input signal.

Figure 8:
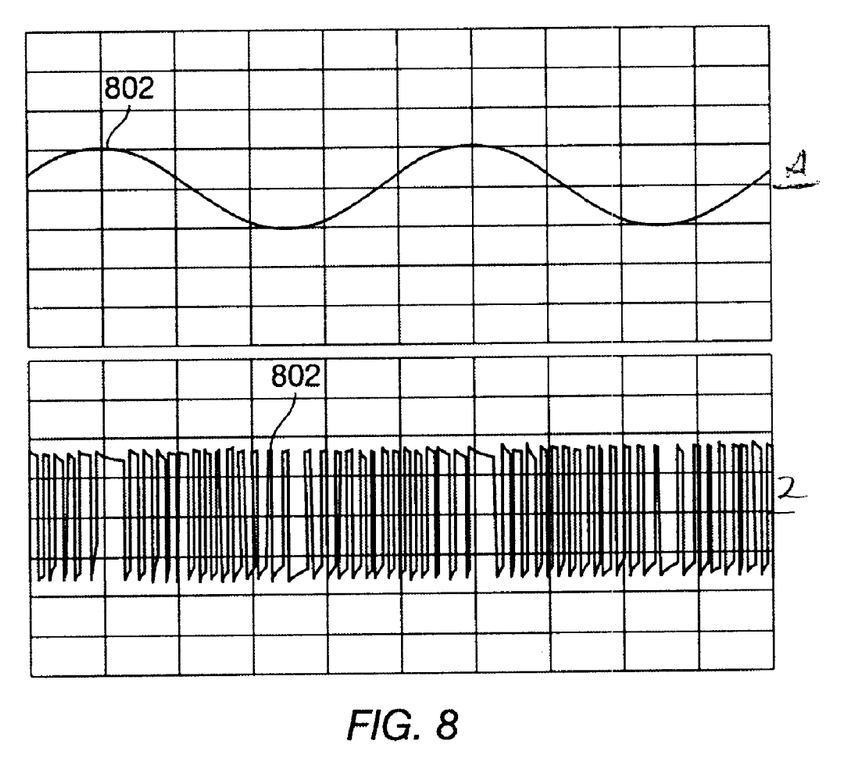
FIG. 8 illustrates a typical measured response of a delta modulator using a circuit configuration having an N-Shape transfer characteristic, such as the circuit shown in FIG. 7.

FIG. 8 illustrates a typical measured response of a sigma delta modulator using a circuit configuration having an N-Shape transfer characteristic, such as the circuit shown in FIG. 7. An input signal 802 is a sine wave. An output signal 804 corresponding to the input signal 802 is a string of pulses with varying widths. As seen in FIG. 8, the pulses are modulated. The pulse width depends on the amplitude of the input signal, verifying the fact that the amplitude of the input signal is modulating the pulses.

Although the present invention has been described in terms of specific embodiments, it should be apparent to those skilled in the art that the scope of the present invention is not limited to the described specific embodiments.

The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for generating oscillating signals from analog signals comprising:

providing an analog signal having a variable slope to a circuit with a variable operating point and having a transfer function characterized by an unstable operating region bounded by a first and a second stable operating region, said unstable operating region being symmetric about an origin point of said transfer function, said unstable operating region containing a first and a second reference point, said circuit capable of producing an oscillating signal having a variable duty cycle, said duty cycle increasing as said variable operating point is positioned closer to said first reference point, said duty cycle decreasing as said variable operating point is positioned closer to said second reference point; and positioning said variable operating point substantially within said unstable region to produce said oscillating signal, said positioning of said variable operating point being dependent on said variable slope of said analog signal, wherein said positioning of said operating point relative to said first and said second reference points is a function of said variable slope of said analog signal, wherein said oscillating signal is capable of being used to directly or indirectly generate a delta modulation signal corresponding to said analog signal.

2. The method of claim 1 wherein said first and said second reference points can be adjusted to provide a desired dynamic range of said circuit.

3. The method of claim 1 wherein a more positive value of said slope of said analog signal corresponds to a closer positioning of said variable operating point relative to one of said first and said second reference points, and wherein a more negative value of said slope of said analog signal corresponds to a closer positioning of said variable operating point relative to another of said first and said second reference points.

4. The method of claim 1 wherein said variable operating point at or near said origin point corresponds to said duty cycle being at or near 50%.

5. The method of claim 1 wherein said oscillating signal comprises a plurality of pulses.

6. The method of claim 1 further comprising a step of generating said delta modulation signal from said oscillating signal.

7. An apparatus for generating oscillating signals from analog signals comprising:

a circuit with a variable operating point and having a transfer function characterized by an unstable operating region bounded by a first and a second stable operating region, said unstable operating region containing a first and a second reference point, said unstable operating region symmetric about an origin of said transfer function, said circuit capable of producing an oscillating signal having a variable duty cycle, said duty cycle increasing as said variable operating point is positioned closer to said first reference point, said duty cycle decreasing as said variable operating point is positioned closer to said second reference point; and an input to provide an analog signal having a variable slope to said circuit, wherein said variable operating point is positioned substantially within said unstable region to produce said oscillating signal, wherein positioning of said variable operating point relative to said first and said second reference points corresponds to said variable slope of said analog signal;

wherein said oscillating signal is capable of being used to directly or indirectly generate a delta modulation signal corresponding to said analog signal.

8. The apparatus of claim 7 wherein said first and said second reference points can be adjusted to provide a desired dynamic range of said circuit.

9. The apparatus of claim 7 wherein a more positive value of said slope of said analog signal corresponds to a closer positioning of said variable operating point relative to one of said first and said second reference points, and wherein a more negative value of said slope of said analog signal corresponds to a closer positioning of said variable operating point relative to another of said first and said second reference points.

10. The apparatus of claim 7 wherein said variable operating point at or near said origin corresponds to said duty cycle being at or near 50%.

11. The apparatus of claim 7 wherein said oscillating signal comprises a plurality of pulses.

12. A system for generating oscillating signals from analog signals comprising:

means for providing an analog signal having a variable amplitude to a circuit with a variable operating point and having a transfer function characterized by an unstable operating region bounded by a first and a second stable operating region, said unstable operating region symmetric about an origin of said transfer function, said unstable operating region containing a first and a second reference point, said circuit capable of producing an oscillating signal having a variable duty cycle, said duty cycle increasing as said variable operating point is positioned closer to said first reference point, said duty cycle decreasing as said variable operating point is positioned closer to said second reference point; and means for positioning said variable operating point substantially within said unstable region to produce said oscillating signal, wherein positioning of said variable operating point relative to said first and said second reference points corresponds to said variable amplitude of said analog signal;

wherein said oscillating signal is capable of being used to directly or indirectly generate a delta modulation signal corresponding to said analog signal.

13. A method for generating oscillating signals from analog signals comprising:

providing an analog signal having a variable amplitude to a circuit with a variable operating point and having a transfer function characterized by an unstable operating region bounded by a first and a second stable operating region, said unstable operating region symmetric about an origin point of said transfer function, said unstable operating region containing a first and a second reference point, said circuit capable of producing an oscillating signal having a variable duty cycle, said duty cycle increasing as said variable operating point is positioned closer to said first reference point, said duty cycle decreasing as said variable operating point is positioned closer to said second reference point; and positioning said variable operating point substantially within said unstable region to produce said oscillating signal, wherein positioning of said variable operating point relative to said first and said second reference points corresponds to said variable amplitude of said analog signal;

wherein said oscillating signal is capable of being used to directly or indirectly generate a sigma delta modulation signal corresponding to said analog signal.

14. The method of claim 13 wherein said first and said second reference points can be adjusted to provide a desired dynamic range of said circuit.

15. The method of claim 13 wherein a more positive value of said amplitude of said analog signal corresponds to a closer positioning of said variable operating point relative to one of said first and said second reference points, and wherein a more negative value of said amplitude of said analog signal corresponds to a closer positioning of said variable operating point relative to another of said first and said second reference points.

16. The method of claim 13 wherein said variable operating point at or near said origin point corresponds to said duty cycle being at or near 50%.

17. The method of claim 13 wherein said oscillating signal comprises a plurality of pulses.

18. An apparatus for generating oscillating signals from analog signals comprising:

a circuit with a variable operating point and having a transfer function characterized by an unstable operating region bounded by a first and a second stable operating region, said unstable operating region being symmetric about an origin of said transfer function, said unstable operating region containing a first and a second reference point, said circuit capable of producing an oscillating signal having a variable duty cycle, said duty cycle increasing as said variable operating point is positioned closer to said first reference point, said duty cycle decreasing as said variable operating point is positioned closer to said second reference point; and an input to provide an analog signal having a variable amplitude to said circuit, wherein said variable operating point is positioned substantially within said unstable region to produce said oscillating signal, wherein positioning of said variable operating point relative to said first and said second reference points corresponds to said variable amplitude of said analog signal;

wherein said oscillating signal is capable of being used to directly or indirectly generate a sigma delta modulation signal corresponding to said analog signal.

19. The apparatus of claim 18 wherein said first and said second reference points can be adjusted to provide a desired dynamic range of said circuit.

20. The apparatus of claim 18 wherein a more positive value of said amplitude of said analog signal corresponds to a closer positioning of said variable operating point relative to one of said first and said second reference points, and wherein a more negative value of said amplitude of said analog signal corresponds to a closer positioning of said variable operating point relative to another of said first and said second reference points.

21. The apparatus of claim 18 wherein said variable operating point at or near said origin corresponds to said duty cycle being at or near 50%.

22. The apparatus of claim 18 wherein said oscillating signal comprises a plurality of pulses.

23. A system for generating oscillating signals from analog signals comprising:

means for providing an analog signal having a variable amplitude to a circuit with a variable operating point and having a transfer function characterized by an unstable operating region bounded by a first and a second stable operating region, said unstable operating region symmetric about an origin point of said transfer function, said unstable operating region containing a first and a second reference point, said circuit capable of producing an oscillating signal having a variable duty cycle, said duty cycle increasing as said variable operating point is positioned closer to said first reference point, said duty cycle decreasing as said variable operating point is positioned closer to said second reference point; and means for positioning said variable operating point substantially within said unstable region to produce said oscillating signal, wherein positioning of said variable operating point relative to said first and said second reference points corresponds to said variable amplitude of said analog signal;

wherein said oscillating signal is capable of being used to directly or indirectly generate a sigma delta modulation signal corresponding to said analog signal.

* * * * *